United States Patent
Im et al.

(10) Patent No.: US 11,031,379 B2
(45) Date of Patent: Jun. 8, 2021

(54) STRAY INDUCTANCE REDUCTION IN PACKAGED SEMICONDUCTOR DEVICES

(71) Applicant: SEMICONDUCTOR COMPONENTS INDUSTRIES, LLC, Phoenix, AZ (US)

(72) Inventors: Seungwon Im, Seoul (KR); ByoungOk Lee, Incheon (KR); Oseob Jeon, Seoul (KR)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 41 days.

(21) Appl. No.: 16/671,450

(22) Filed: Nov. 1, 2019

(65) Prior Publication Data

US 2021/0066256 A1    Mar. 4, 2021

Related U.S. Application Data

(60) Provisional application No. 62/895,875, filed on Sep. 4, 2019.

(51) Int. Cl.
*H01L 25/07* (2006.01)
*H01L 23/00* (2006.01)
(Continued)

(52) U.S. Cl.
CPC .......... *H01L 25/072* (2013.01); *H01L 21/565* (2013.01); *H01L 23/3121* (2013.01);
(Continued)

(58) Field of Classification Search
CPC ....... H01L 25/072; H01L 24/00; H01L 24/84; H01L 24/85; H01L 24/92; H01L 24/73;
(Continued)

(56) References Cited

U.S. PATENT DOCUMENTS

| 7,759,778 B2 | 7/2010 | Lowry et al. |
| 9,214,415 B2 * | 12/2015 | Denison .................. H01L 21/50 |
| 10,090,279 B2 | 10/2018 | Im et al. |
| 2008/0164590 A1 * | 7/2008 | Xiaochun ......... H01L 23/49562 |
| | | 257/675 |
| 2009/0116197 A1 | 5/2009 | Funakoshi et al. |

(Continued)

FOREIGN PATENT DOCUMENTS

| EP | 2015626 A2 | 1/2009 |
| EP | 2725699 A1 | 4/2014 |

(Continued)

OTHER PUBLICATIONS

Extended European Search Report for European Application No. 18157477.3, dated Jul. 19, 2018, 10 pages.

(Continued)

*Primary Examiner* — Dao H Nguyen
(74) *Attorney, Agent, or Firm* — Brake Hughes Bellermann LLP (57) ABSTRACT

In a general aspect, a semiconductor device can include a substrate and a positive power supply terminal electrically coupled with the substrate, the positive power supply terminal being arranged in a first plane. The device can also include a first negative power supply terminal, laterally disposed from the positive power supply terminal and arranged in the first plane. The device can further include a second negative power supply terminal, laterally disposed from the positive power supply terminal and arranged in the first plane. The positive power supply terminal can be disposed between the first and second negative power supply terminals. The device can also include a conductive clip electrically coupling the first negative power supply terminal with the second negative power supply terminal via a conductive bridge. A portion of the conductive bridge can be (Continued)

arranged in a second plane that is parallel to, and non-coplanar with the first plane.

20 Claims, 10 Drawing Sheets

(51) Int. Cl.
  *H01L 23/31* (2006.01)
  *H01L 21/56* (2006.01)
  *H01L 23/498* (2006.01)
(52) U.S. Cl.
  CPC ........ *H01L 23/49811* (2013.01); *H01L 24/40* (2013.01); *H01L 24/48* (2013.01); *H01L 24/73* (2013.01); *H01L 24/84* (2013.01); *H01L 24/85* (2013.01); *H01L 24/92* (2013.01); *H01L 2224/40227* (2013.01); *H01L 2224/48227* (2013.01); *H01L 2224/73221* (2013.01); *H01L 2224/84815* (2013.01); *H01L 2224/92166* (2013.01); *H01L 2924/13055* (2013.01); *H01L 2924/30107* (2013.01)
(58) Field of Classification Search
  CPC .................. H01L 24/48; H01L 21/565; H01L 23/3121; H01L 23/49811; H01L 2224/73221; H01L 2224/84815; H01L 2224/48227; H01L 2224/92166; H01L 2224/40227; H01L 2924/30107; H01L 2924/13055
  USPC ............... 257/139, 667, 675, 676, 712, 773, 257/E23.031, E23.049, E23.051, E23.066, 257/E23.079, E21.158, E21.499, E21.505, 257/E25.014, E25.016; 361/707, 719; 438/107, 121, 123, 612
  See application file for complete search history.

(56) References Cited

U.S. PATENT DOCUMENTS

| | | | |
|---|---|---|---|
| 2009/0230536 A1* | 9/2009 | Liu | H01L 23/49551 257/690 |
| 2010/0237507 A1 | 9/2010 | Yamada et al. | |
| 2013/0001759 A1 | 1/2013 | Kim et al. | |
| 2013/0043593 A1* | 2/2013 | Domes | H01L 23/49833 257/758 |
| 2013/0062751 A1 | 3/2013 | Takagi et al. | |
| 2014/0117523 A1* | 5/2014 | Ho | H01L 23/4952 257/676 |
| 2014/0291696 A1 | 10/2014 | Horimoto et al. | |
| 2015/0131232 A1* | 5/2015 | Ishino | H01L 25/07 361/707 |
| 2016/0079142 A1* | 3/2016 | Hasegawa | H01L 25/072 |
| 2016/0308456 A1 | 10/2016 | Nakatsu et al. | |
| 2017/0237311 A1 | 8/2017 | Sakai et al. | |
| 2019/0244888 A1* | 8/2019 | Kawashima | H01L 23/49861 |

FOREIGN PATENT DOCUMENTS

| | | |
|---|---|---|
| JP | 2001326325 A | 11/2001 |
| JP | 2010016947 A | 1/2010 |
| WO | 2016017267 A1 | 2/2016 |

OTHER PUBLICATIONS

Power Electronic Systems Laboratory, "Ultra-Low-Inductance Power Module for Fast Switching Semiconductors," Proceedings of the PCIM Europe Conference for Power Electronics, Intelligent Motion, Renewable Energy and Energy Management Nuremberg, Germany, May 14-16, 2013.

* cited by examiner

STRAY INDUCTANCE REDUCTION IN PACKAGED SEMICONDUCTOR DEVICES

CROSS-REFERENCE TO RELATED APPLICATIONS

This application claims the benefit of U.S. Provisional Patent Application No. 62/895,875, filed on Sep. 4, 2019, the entire contents of which is incorporated herein by reference.

TECHNICAL FIELD

This description relates to packaged semiconductor devices (packaged devices). More specifically, this description relates to packaged devices that implement parallel current paths to reduce stray inductance.

BACKGROUND

Semiconductor devices can be included in package assemblies, where such package assemblies can include one or more semiconductor devices (semiconductor die). The performance of semiconductor devices in such package assemblies can be adversely impacted by parasitic impedance, such as parasitic (stray) inductance. For instance, performance of power semiconductor devices in an associated package assembly can be affected by stray inductance resulting from magnetic fields associated with high currents conducted by those power semiconductor devices. Current package assemblies are limited (e.g., due to design rules, etc.) in the measures that can be implemented to reduce such stray inductance. Accordingly, alternative approaches for reducing stray (parasitic) inductance would be beneficial in order to improve performance of power semiconductor devices included in package assemblies.

SUMMARY

In a general aspect, a packaged semiconductor device can include a substrate and a positive power supply terminal electrically coupled with the substrate, the positive power supply terminal being arranged in a first plane. The packaged device can also include a first negative power supply terminal, laterally disposed from the positive power supply terminal and arranged in the first plane. The packaged device can further include a second negative power supply terminal laterally disposed from the positive power supply terminal and arranged in the first plane. The positive power supply terminal can be disposed between the first negative power supply terminal and the second negative power supply terminal. The packaged device can also include a conductive clip electrically coupling the first negative power supply terminal with the second negative power supply terminal via a conductive bridge. A portion of the conductive bridge can be arranged in a second plane that is parallel to, and non-coplanar with the first plane.

Like reference symbols in the various drawings indicate like elements. Reference numbers for some like elements may not be repeated for all such elements. In certain instances, different reference numbers may be used for like, or similar elements. Some reference numbers for certain elements of a given implementation may not be repeated in each drawing corresponding with that implementation. Some reference numbers for certain elements of a given implementation may be repeated in other drawings corresponding with that implementation, but may not be specifically discussed with reference to each corresponding drawing.

DETAILED DESCRIPTION

This disclosure relates to packaged semiconductor device apparatus and associated methods of manufacturing. The approaches illustrated and described herein can be used to produce packaged semiconductor devices that operate with reduced stray inductance as compared to current implementations, where stray inductance can be measured as a series inductance between power supply terminals. As indicated above, such stray inductance can be caused (e.g., during operation of a given device) by magnetic fields that are generated by currents flowing into and out of the power supply terminals, where the magnetic field lines resulting from current associated with one power supply terminal being incident on a current path associated with another (e.g., coplanar) power supply terminal, and vice versa.

In the approaches described herein, stray inductance can be reduced as a result of implementing power supply terminals (e.g., DC+ and DC− terminals) and internal routing of currents associated with the respective power supply terminals using a plurality of conductive clips, such that respective current paths for those currents are substantially parallel with one another. That is, in the disclosed implementations, the current paths can be configured such that a general direction of current flow associated with one power supply terminal is parallel with a general direction of current flow associated with the other power supply terminal. Such arrangements can reduce stray inductance of a power semiconductor device or module. For instance, such reductions in stray inductance can be realized as a result of overlap (e.g., increased overlap) between respective magnetic fields corresponding with current associated with each power supply terminal causing those magnetic fields to cancel each other, rather than being incident on the opposing power supply terminal without a parallel arrangement, thus reducing stray inductance.

Figure 1:
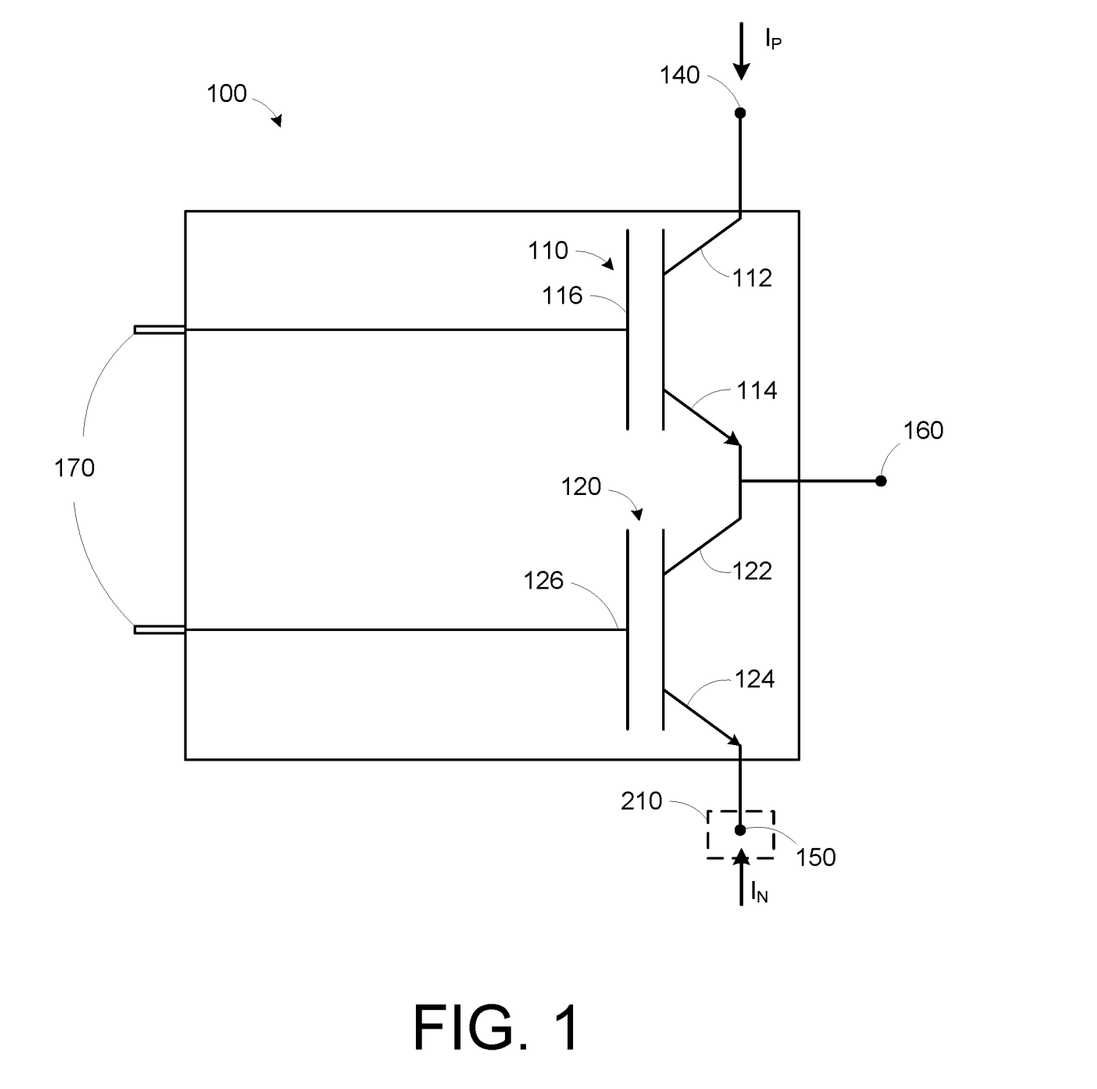
FIG. 1 is a schematic diagram illustrating a power semiconductor circuit that can be included in a packaged semiconductor device, according to an implementation.

FIG. 1 is a schematic diagram illustrating a power semiconductor circuit 100 that can be included in a packaged semiconductor device, according to an implementation. The circuit 100, a power transistor pair, is given by way of example and for purposes of illustration. In other implementations, the approaches described herein can be used in conjunction with other semiconductor devices, other power semiconductor circuits, other semiconductor device modules, etc. While certain elements of the circuit 100 are referenced with respect to other drawings, in other implementations, other arrangements and/or approaches are possible.

As shown in FIG. 1, the circuit 100 can include a first power semiconductor device, an insulated-gate bipolar transistor (IGBT) 110, and a second power semiconductor device, an IGBT 120. The IGBTs 110 and 120 can be implemented in one or more semiconductor die. In some implementations, other power semiconductor devices could be used such as power metal-oxide semiconductor field effect transistors (power FETs), or circuits having other arrangements could be implemented. In some implementations, the IGBTs 110 and 120 can respectively include multiple IGBTs coupled in parallel with each other. For instance, the IGBT 110 could include two or more IGBTs coupled in parallel with each other, and the IGBT 120 could include two or more IGBTs coupled in parallel with each other.

In the circuit 100, the IGBT 110 includes a collector 112, an emitter 114 and a gate 116. Likewise, the IGBT 120 includes a collector 122, an emitter 124 and a gate 126. The emitter 114 of the IGBT 110 and the collector 122 of the IGBT 120 are electrically coupled to a common node of the circuit 100, on which an output signal (e.g., a regulated voltage) can be produced by the circuit 100.

In the circuit 100, a positive power supply terminal 140 (e.g., a DC+ terminal, a Vdd terminal, etc.) can be coupled with the collector 112 of the IGBT 110. A negative power supply terminal 150 (e.g., a DC− terminal, an electrical ground terminal, etc.) can be coupled with the emitter 124 of the IGBT 120. In some implementations, such as those described herein, the negative power supply terminal 150 can be implemented using multiple negative power supply terminals (e.g., terminals 150a and 150b in FIGS. 2A-2E) and a conductive clip 210 (e.g., such as the conductive clip 210 shown in FIGS. 2A-2E) to provide for parallel current paths in the supply terminals for a positive supply current $I_P$ and a negative power supply current $I_N$, as are indicated in FIG. Further, as described with respect to implementations disclosed herein, elements of a packaged semiconductor device can be arranged such that respective internal current paths for the positive supply current $I_P$ and the negative power supply current $I_N$ are also parallel (generally parallel, substantially parallel, etc.)

Further, an output terminal 160 of the circuit 100 can be coupled with the common node of the emitter 114 of the IGBT 110 and the collector 122 of the IGBT 120. As described further below, the positive power supply terminal 140, the negative power supply terminal(s) 150 and the output terminal 160 can be implemented using metal terminals (copper terminals, metal leads) that are included in a packaged semiconductor device. For instance, the positive power supply terminal 140 and the output terminal 160 can, in some implementations, be electrically and physically coupled with a substrate on which the IGBTs 110 and 120 are implemented. The negative power supply terminal(s) 150 can be electrically and physically coupled with a conductive clip included in a packaged semiconductor. For instance, the terminals 140 and 160 can be directly bonded (using direct-lead-attachment (DLA)) to the substrate, while the terminal(s) 150 can be directly bonded (using DLA) to a conductive clip, such as in the example implementations described below.

As further illustrated in FIG. 1, the circuit 100 can also include a plurality of signal leads 170 that are electrically coupled with respective gate terminals of the IGBTs 110 and 120. For instance, as shown in FIG. 1, a first signal lead 170 can be electrically coupled with a gate terminal 116 of the IGBT 110, and a second signal lead 170 can be electrically coupled with a gate terminal 126 of the IGBT 120. In other implementations, signal leads 170 could be electrically (or operatively) coupled with other elements included in the circuit 100, such as a control circuit (not shown). The particular signal leads 170 (and connections to/from the signal leads 170) that are implemented in the circuit 100 will depend on the particular implementation, and the specific configuration of the circuit. As some examples, the signal leads 170 can include gate control signal leads (e.g., as shown in FIG. 1), temperature sense signal leads, voltage sense signal leads, etc.

FIGS. 2A through 2E are diagrams illustrating various views of a packaged semiconductor device (device) 200, according to an implementation. In some implementations, the device 200 can implement the circuit 100, can implement a similar circuit (e.g., including additional components, such as passive devices, a control circuit, etc.), or can implement a different circuit. However, for purposes of illustration, the example device implementations illustrated herein will be described as implementing the circuit 100, with further reference being made to FIG. 1.

Figure 2A:
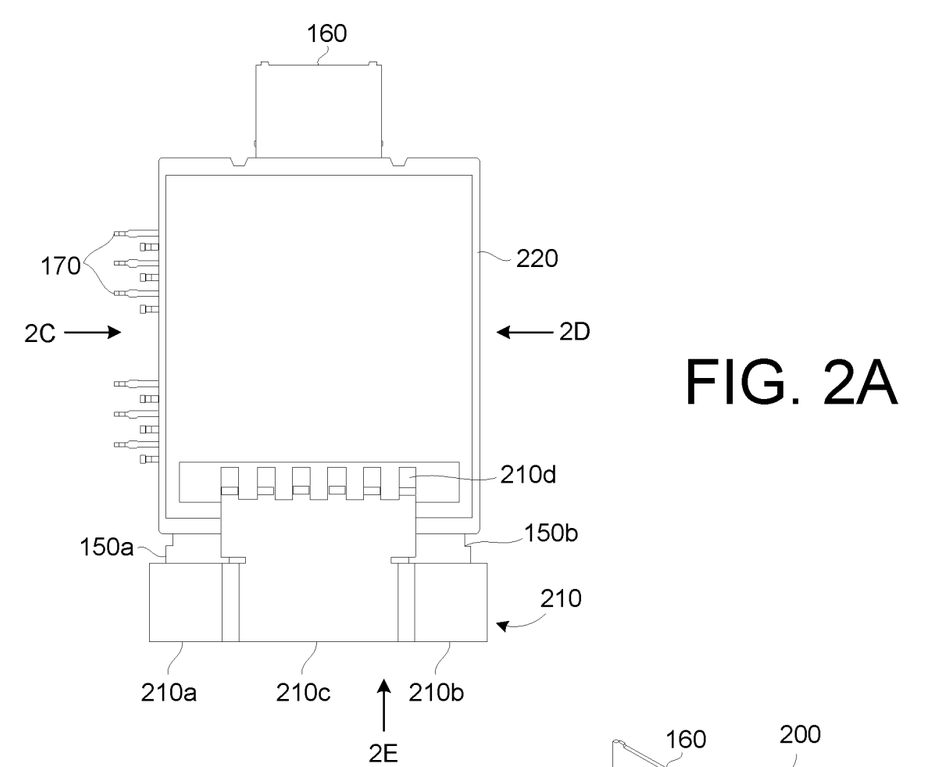
FIGS. 2A through 2E are diagrams illustrating various views of a packaged semiconductor device, according to an implementation.
Figure 2B:
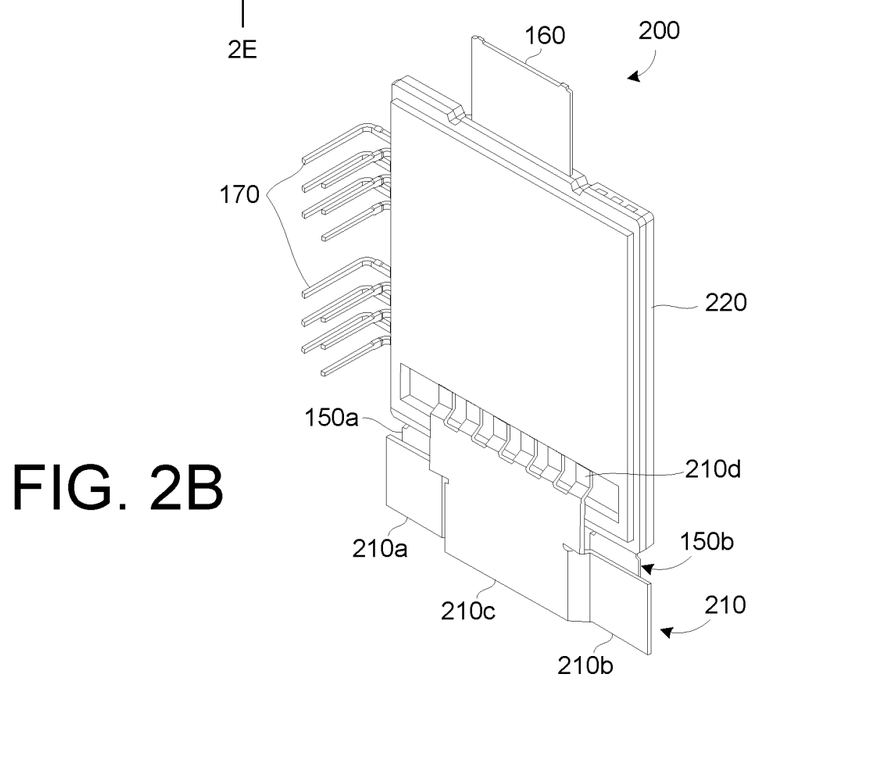

FIG. 2A shows a plan view of the device 200 and FIG. 2B shows an isometric view of the device 200. As shown in FIGS. 2A and 2B, the device 200 can include multiple negative power supply terminals 150a and 150b, an output terminal 160 and signal leads 170 of the circuit 100. The device 200 can also include a conductive clip (a first conductive clip) 210 and a molding compound 200 (e.g., a gel molding compound, an epoxy molding compound, etc.) that encapsulates elements of the device 200, such as in the example implementations illustrate in the drawings and described herein. The device 200 can also include the positive power supply terminal 140 of the circuit 100, which, in the views of FIGS. 2A and 2B is obscured by the conductive clip 210.

In the device 200, the conductive clip 210 includes a first portion 210a that is coupled (e.g., physically and electrically coupled), such as using solder, with the negative power supply terminal 150a. The conductive clip 210 further includes a second portion 210b that is coupled (e.g., physically and electrically coupled), such as using solder, with the negative power supply terminal 150b. As shown in FIGS. 2A and 2B, the conductive clip 210 also includes a third portion including a conductive bridge 210c that electrically couples the first portion 210a and the first negative power supply terminal 150a with the second portion 210b and the second negative power supply terminal 150b. The conductive clip 210 of the device 200 also includes a plurality of conductive fingers 210d that can be directly coupled (e.g., using DLA) with another conductive clip (e.g., a second conductive clip 240 shown in FIG. 2D) that is at least partially encapsulated in the molding compound 220. For instance, in some implementations, contact points for coupling the second conductive clip with the conductive fingers 210d can be exposed through the molding compound 210d.

Figure 2C:
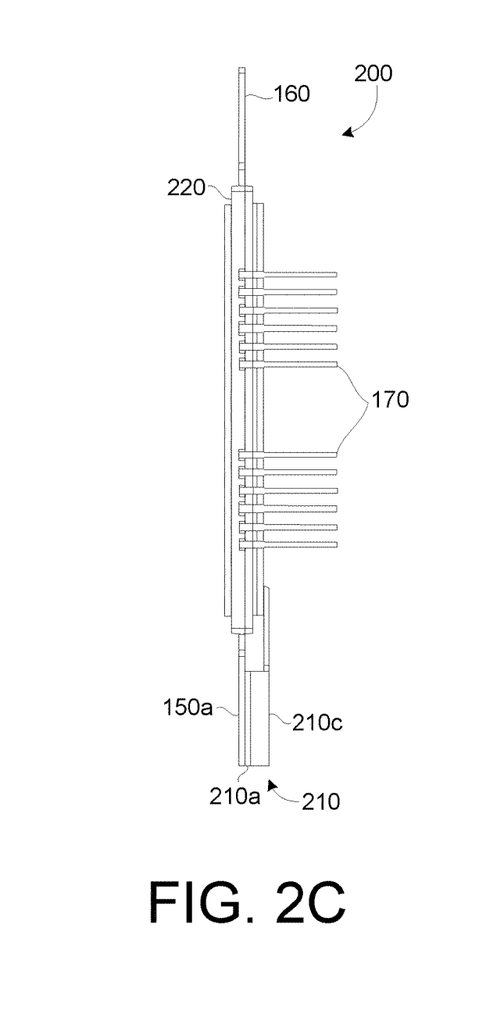
Figure 2D:
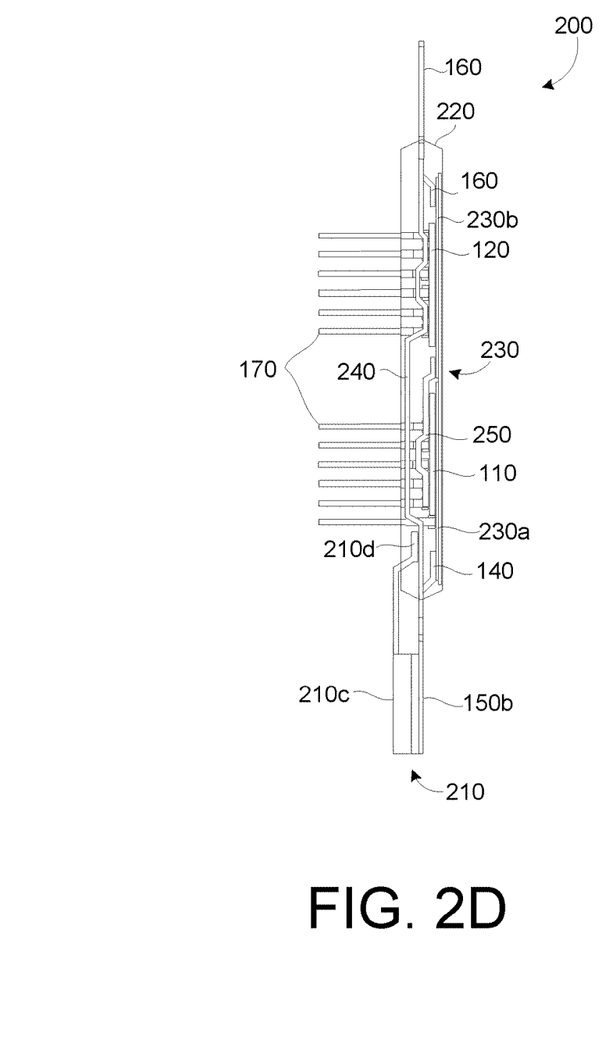
Figure 2E:
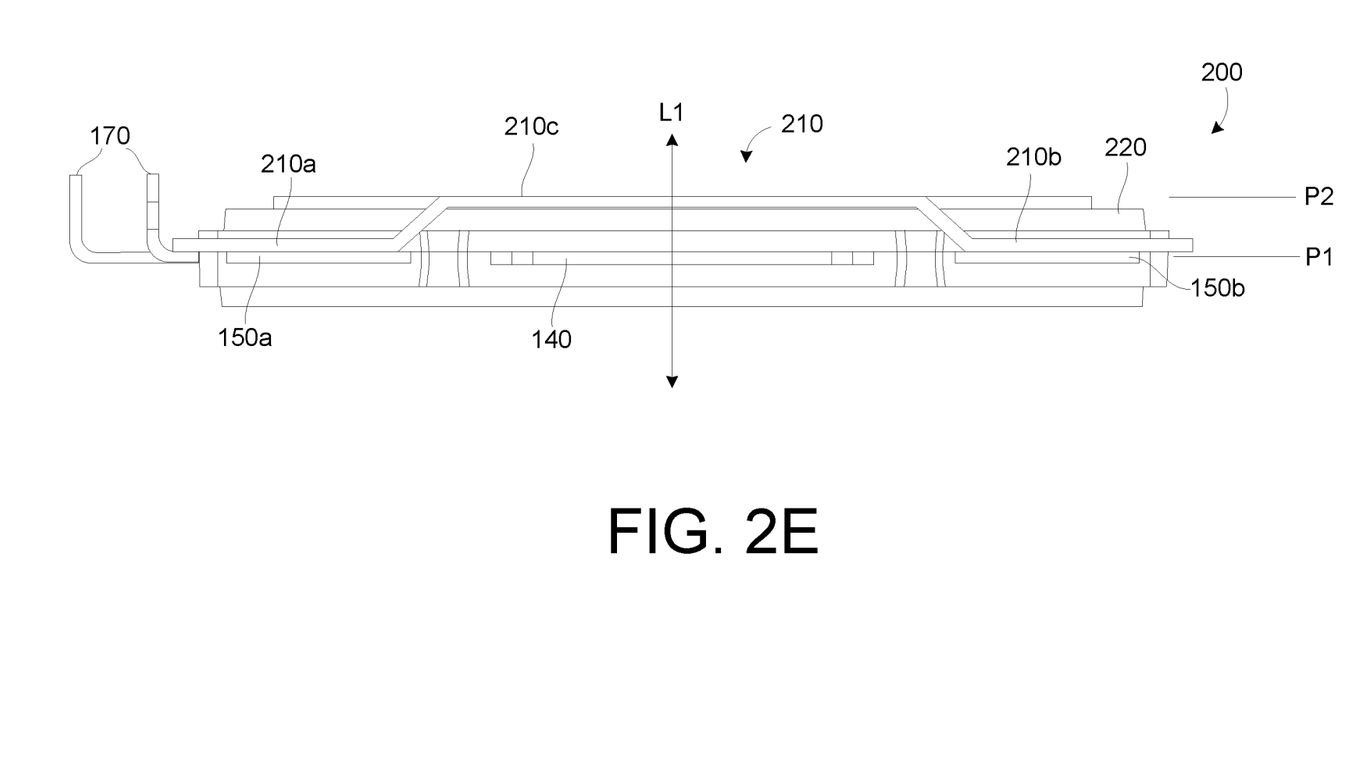

Referring to FIG. 2A, direction lines 2C, 2D and 2E are illustrated, where the direction lines correspond, respectively, with directions of view for side views of the device 200 shown in FIGS. 2C, 2D and 2E. That is, FIG. 2C is a side view of the device 200 along the direction line 2C in FIG. 2A, FIG. 2D is a side view of the device 200 along the direction line 2D in FIG. 2A, and FIG. 2E is a side view of the device 200 along the direction line 2E in FIG. 2A. The side view of FIG. 2D is an x-ray view, showing the internal structure of the device 200. As with the views shown in FIGS. 2A and 2B, the positive power supply terminal 140, in FIGS. 2C and 2D, is obscured by the first negative power supply terminal 150a (in FIG. 2C) or by the second negative power supply terminal 150b (in FIG. 2D), as the positive power supply terminal 140, the first negative power supply terminal 150a, and the second negative power supply terminal 150b are all arranged in a same (first) plane.

Referring to FIG. 2C, arrangement of the output terminal 160 and the signal leads 170 along respective sides of the device 200 is illustrated. As shown in FIG. 2C, the output terminal 160 and the signal leads 170 can extend out of the molding compound 220, where a portion of the output terminal 160 and a respective portion of each of the signal leads 170 is disposed within (encapsulated in) the molding compound 220.

FIG. 2C also further illustrates the arrangement of the first negative power supply terminal 150a and the conductive clip 210. As shown in FIG. 2C, the first portion 210a of the conductive clip 210 is disposed on (coupled to, soldered to, etc.) the first negative power supply terminal 150a. Further, the conductive bridge 210c of the conductive clip 210 is spaced away from the first negative power supply terminal 150a, and also from the positive power supply terminal (not visible in FIG. 2C), where the positive power supply terminal is arranged in a same (first) plane as the first negative power supply terminal 150a, as previously discussed. In other words, in the device 210, the conductive bridge 210c of the conductive clip 210 can be arranged in a plane (a second plane) that is parallel to, but non-coplanar with the first plane (in which the positive power supply terminal, and the negative power supply terminals 150a and 150b are arranged).

Referring to FIG. 2D, a side (x-ray) view of the device 200 is shown, illustrating the internal structure of the device 200, and the association of that internal structure with other elements of the device 200, such as the internal structure discussed further below. FIG. 2D also illustrates, similar to the arrangement of the first negative power supply terminal 150a and the conductive clip 210 in FIG. 2C, the arrangement of the second negative power supply terminal 150b and the conductive clip 210. For instance, as shown in FIG. 2D, the second portion 210b of the conductive clip 210 is disposed on (coupled to, soldered to, etc.) the second negative power supply terminal 150b. Further, the conductive bridge 210c of the conductive clip 210 is spaced away (in a different, parallel plane) from the second negative power supply terminal 150b, and likewise from the positive power supply terminal. Similar to FIG. 2C, the positive power supply terminal in FIG. 2D is obscured by (is behind) the second negative power supply terminal 150b. However, a conductive finger of the positive power supply terminal 140 (which can be disposed within the molding compound 220) is shown in FIG. 2D.

In the example device 200 of FIG. 2D, the conductive fingers 210d of the conductive clip 210 can be coupled with (electrically coupled with, soldered to, etc.) a second conductive clip 240 that is disposed (at least in part) within the molding compound 220. For instance, as noted above, contact points on the conductive clip 240 for attachment of the conductive fingers 210d of the conductive clip 210 can be exposed through the molding compound (e.g., by etching, grinding, use of a molding jig, etc.).

The device 200, as illustrated in FIG. 2D further includes a substrate 230, the IGBTs 110 and 120 of the circuit 100 (implemented as first and second semiconductor die), and yet another (third) conductive clip 250. The substrate 230 includes a first metal layer 230a, and a second metal layer 230b that is electrically isolated from the first metal layer 230a. As shown in FIG. 2D, the IGBT 110 (in the form of a first semiconductor die) can be disposed on the first metal layer 230a. For instance, referring to the circuit 100, in this example, the collector terminal 112 (e.g., a backside collector contact) of the semiconductor die implementing the IGBT 110 (e.g., a high-side transistor of the power transistor pair) can be coupled with the first metal layer 230a. Further, a conductive finger (or conductive fingers) of the positive power supply terminal 140 is (are) coupled with (e.g., electrically coupled using DLA) the metal layer 230a of the substrate 230. Accordingly, in the device 200 with reference to the circuit 100, the positive power supply terminal 140 is coupled with the collector terminal 112 of the IGBT 110 via the metal layer 230a.

In the example implementation of the FIG. 2D, in addition to the conductive clip 210, the second negative power supply terminal 150b (as well as the first negative power supply terminal 150a, which is obscured in FIG. 2D) are coupled to (e.g., electrically coupled using DLA) the conductive clip 240. Further in the example of FIG. 2D, the conductive clip 240 is coupled (electrically coupled) with the IGBT 120. For instance, referring to the circuit 100, the conductive clip 240 can be coupled with (soldered to) the emitter terminal 124 of the IGBT 120 (e.g., a low-side transistor of the circuit 100 implemented in a second semiconductor die). Accordingly, in the device 200, the first negative power supply terminal 150a, the second negative power supply terminal 150b and the conductive clip 210 are electrically coupled with the emitter terminal 124 of the IGBT 120 via the conductive clip 240.

As also shown in FIG. 2D, the semiconductor die implementing the IGBT 120 can be disposed on the second metal layer 230b of the substrate 230. For instance, referring to the circuit 100, in this example, the collector terminal 122 (e.g., a backside collector contact) of the semiconductor die implementing the IGBT 120 (e.g., a low-side transistor of the power transistor pair) can be coupled with the second metal layer 230b. In the device 200, the metal layer 230b corresponds with (is electrically coupled with) the output terminal 160 of the circuit 100. For instance, as illustrated in FIG. 2D, a conductive finger (or conductive fingers) of the output terminal 160 is (are) coupled with (electrically coupled with) the metal layer 230b.

In the device 200, as shown in FIG. 2D, the third conductive clip 250 that electrically couples the emitter terminal 114 of the semiconductor die implementing the (high-side) IGBT 110 with the second metal layer 230b of the substrate (e.g., the output terminal 160 and the collector terminal 122 of the IGBT 120). As shown in FIG. 2D, the second conductive clip 240 and the third conductive clip 250 are arranged in a parallel, non-coplanar arrangement with each other. In this example, as the conductive clip 240 conducts current associated with the negative supply terminal 150 of the circuit 100, and the conductive clip 250 conducts current associated with the positive power supply terminal 140 of the circuit 100, their parallel arrangement can result in magnetic fields associated with their respective currents cancelling each other (at least in part), resulting in a reduction in stray inductance in the device 200 as compared with current devices (e.g., implemented with coplanar current conduction)

As is illustrated by FIGS. 2A-2D (as well as FIG. 2E), in the device 200, the molding compound 220 partially encapsulates the substrate 230, where a surface (e.g., a bottom surface) of the substrate 230 is exposed through the molding compound 220. This surface of the substrate 230 can be used for attachment of heat transfer mechanism, such as a heat sink, water jacket, etc. In the device 200, as noted above, the molding compound 220 also partially encapsulates the conductive clip 240, where one or more portions of the conductive clip 240 (e.g., contact points for the conductive clip 210) are exposed through the molding compound 220.

Further in the device 200, the molding compound 220 can encapsulate (fully encapsulate) the conductive clip 250, and the semiconductor die implementing the IGBTs 110 and 120. As previously noted, in the device 200, the first negative power supply terminal 150a, the second negative power supply terminal 150b and the conductive clip 210 are disposed, at least in part, external to the molding compound 220. For instance, the first negative power supply terminal 150a and the second negative power supply terminal 150b can extend out of the molding compound 220 (having respective portions disposed within the molding compound 220), while the conductive clip 210 can be wholly disposed outside the molding compound 220.

FIG. 2E, as noted above, is a diagram illustrating a view of the device 200 along the direction line 2E shown in FIG. 2A. The view in FIG. 2E shows the arrangement of the negative supply terminals 150a and 150b, the conductive clip 210, and the positive power supply terminal 140 of the device 200. FIG. 2E also illustrates the arrangement of the signal leads 170 in the device 200 when viewed along the direction line 2E. As with the output terminal 160 (e.g., as shown in FIG. 2C) and the signal leads 170 (e.g., as shown in FIGS. 2C and 2E), the positive power supply terminal 140 and the negative power supply terminals 150a and 150b can extend out of the molding compound 220, where a portion of the positive power supply terminal 140 and a respective portion of each of the negative power supply terminals 150a and 150b is disposed within (encapsulated in) the molding compound 220.

As illustrated in FIG. 2E, the positive power supply terminal 140, and the negative power supply terminals 150a and 150b of the device 200 are arranged in a first plane P1 (e.g., are coplanar). The negative power supply terminals 150a and 150b are laterally disposed, in the plane P1, from respective sides (edges, etc.) of the positive power supply terminal 140. That is, in the device 200, the positive power supply terminal 140 is disposed between the negative power supply terminals 150a and 150b. As also shown in FIG. 2E, the first portion 210a of the conductive clip 210 is coupled to the negative power supply terminal 150a, and the second portion 210b of the conductive clip 210 is coupled to the negative power supply terminal 150b.

In the device 200, as shown in FIG. 2E, the conductive bridge 210c of the conductive clip 210 is disposed in a second plane P2, where the plane P2 is parallel to, but is not coplanar with the plane P1. That is, the conductive bridge 210c is parallel to, and spaced apart from the positive power supply terminal 140. For instance, as shown in FIG. 2E (with additional reference to at least FIG. 2D) a line L1 that is orthogonal to the first plane and the second plane, can intersect both the positive power supply terminal 140 and the conductive bridge 210c due to their parallel arrangement (and vertical alignment, as shown in FIG. 2E).

As the conductive clip 210, in the device 210, is configured to conduct current associated with the negative power supply terminals 150a and 150b, this parallel arrangement with the positive power supply terminal 140 will allow for cancellation of the magnetic fields resulting from respective currents conducted by the positive power supply terminal 140 and the conductive clip 210. Such magnetic field cancellation will achieve a reduction in stray inductance in the device 200 (during operation), as compared to current semiconductor device packages implementing circuits similar to the circuit 100. Further, additional reductions in stray inductance can be achieved due to the negative power supply terminals 150a and 150b being respectively disposed on either side of the positive power supply terminal 140, as such an arrangement can achieve additional cancellation of the respective magnetic fields.

Figure 3:
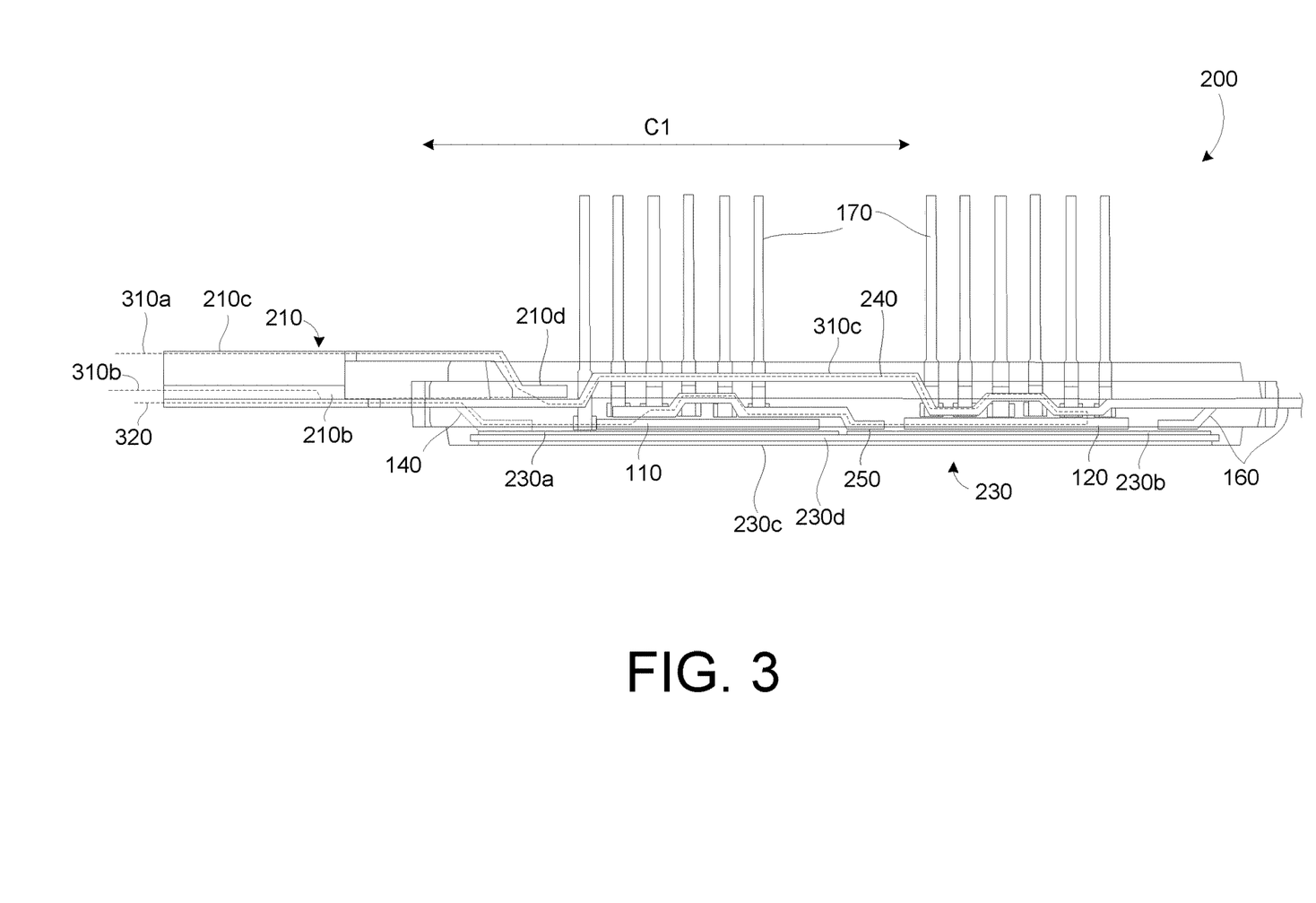
FIG. 3 is a diagram illustrating current paths for the packaged semiconductor device of FIGS. 2A-2E, according to an implementation.

FIG. 3 is a diagram illustrating current paths for the packaged semiconductor device 200 of FIGS. 2A-2E, according to an implementation. The view of the device 200 in FIG. 3 corresponds with the view of the device 200 shown in FIG. 2D, rotated clockwise by 90 degrees. However, in FIG. 3, only a portion of the output terminal 160 external to the molding compound 220 is shown (as is indicated by a cut line). Reference numbers for the elements of the device 200 are included in FIG. 3 for comparison with, at least, FIGS. 2A-2E. However, for purposes of brevity, each of those elements is not described in detail again with respect to FIG. 3.

In FIG. 3, with further reference to the circuit 100 in FIG. 1, lines 310a, 310b and 310c (which can be collectively referred to as line 310) schematically illustrate current associated with the negative power supply terminal 140 of the circuit 100. For instance, the line 310a schematically illustrates current associated with the negative power supply terminal 150 of the circuit 100 that flows through the conductive clip 210 in the device 200. Likewise, the line 310b schematically illustrates current associated with the negative power supply terminal 150 of the circuit 100 that flows through the negative power supply terminals 150a and 150b of the device 200. The line 310c in FIG. 3, schematically illustrates the combination of the currents indicated by the lines 310a and 310b in the conductive clip 240 (e.g., continuing to the emitter terminal 124 of the semiconductor die implementing the IGBT 120). The current 310c can be conducted between the conductive clip 240 and the output terminal 160 through the IGBT 120 (when turned on) and the second metal layer 230b of the substrate 230. Accordingly, in the implementation of the circuit 100 in the device 200, a current path (referred to below as a first current path) between the output terminal 160 and the first negative power supply terminal 150a, the second negative power supply terminal 150b and the conductive clip 210 includes, in sequence starting from the out output terminal 160, the metal layer 230b of the substrate 230, the semiconductor die implementing the IGBT 220, and the conductive clip 240.

As shown in FIG. 3, the substrate 230 can further include a third metal layer 230c that is disposed on an opposite side of the substrate 230 from the first metal layer 230a and the second metal layer 230b. The third metal layer 230c, such as in this example implementation, can be electrically isolated from the first metal layer 230a and 230b by insulating layer 230d of the substrate 230. In some implementations, the insulating layer 230d can be a ceramic layer, or other electrically insulative material. In some implementations, a surface of the third metal layer 230c can be exposed through the molding compound 220, and a thermal dissipation mechanism (not shown), such as a heat sink, can be coupled with the third metal layer 230c to dissipate thermal energy generated (e.g., by the IGBTs 110 and 120) during operation of the device 200.

As shown in FIG. 3, the line 320 indicates a current path (referred to below as a second current path) from the positive power supply terminal 140 (obscured in FIG. 3) to the output terminal 160. As shown in FIG. 3, this current path can include, in sequence, starting from the positive power supply terminal 240, the metal layer 230a of the substrate 230, the semiconductor die implementing the IGBT 110, the conductive clip 250 and the metal layer 230b of the substrate 230. It will be appreciated that turning the IGBT 110 on and off will regulate conduction of current along the second current path indicated the line 320.

As illustrated in FIG. 3, the first current path and the second current path are both generally arranged along the line Cl, with variations in current flow direction occurring due to structure of the elements of the device 200, and at transitions of the current paths between various elements of the device 200. For instance, the clip 240 and the clip 250 can have variations in directions, where those variations in direction can have different radiuses of curvature, so as to maintain the generally parallel arrangement of the first current path (e.g., corresponding with a negative supply current $I_N$, e.g., as shown in FIG. 1) and the second current path (e.g., corresponding with a positive supply current $I_P$, e.g., as shown in FIG. 1). That is, the parallel current paths can follow through changes in their directions due to deflections resulting from arrangement of the various elements of the device 200. For example, as shown in FIG. 3, the first current path and the second current path, can both be generally arranged along the line Cl, are parallel (substantially parallel, generally parallel, etc.) to each other along their respective lengths, with the first current path and second current path both terminating at the metal layer 230b (e.g., at the output terminal 160).

In addition to the stray inductance reduction achieved by the arrangement of the conductive bridge 210c and the positive power supply terminal 140, this parallel arrangement of the respective current paths indicated by the lines 310 and 320 will allow for cancellation of magnetic fields resulting from respective currents conducted along those paths. This magnetic field cancellation can result in further reductions in stray inductance of the device 200, as compared to packaged semiconductor devices implementing similar circuits without such parallel arrangements (e.g., with coplanar current conduction). For instance, in some implementations, stray inductance of the example device 200 can be one-fifth or less (e.g., one-tenth) than stray inductances of current package implementations.

Figure 4A:
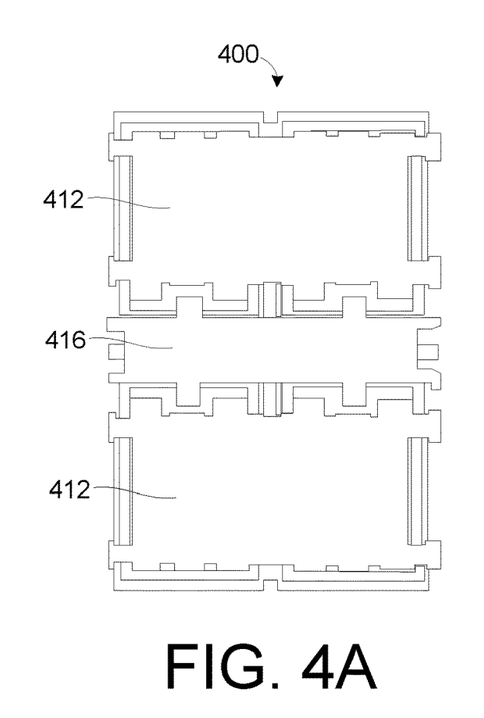
FIGS. 4A and 4B are diagrams illustrating a semiconductor device that can be included in the packaged semiconductor device of FIGS. 2A-2E and 3, according to an implementation.
Figure 4B:
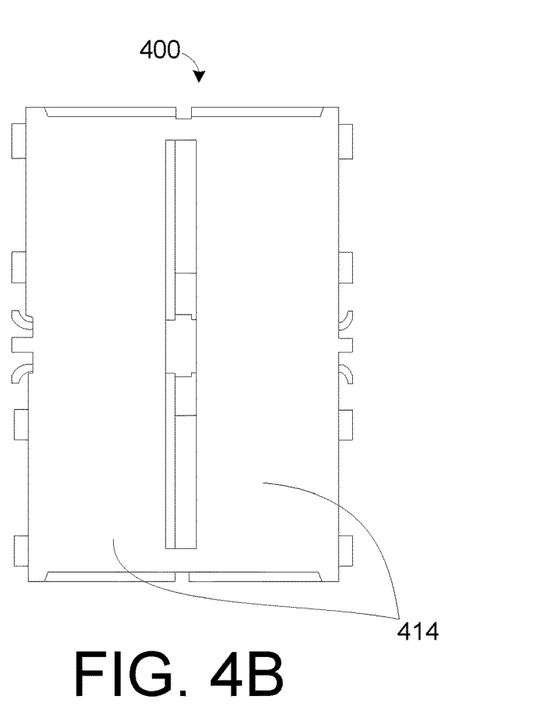

FIGS. 4A and 4B are diagrams illustrating a semiconductor device 400 that can be included in the packaged semiconductor device of FIGS. 2A-2E and 3, according to an implementation. For instance, the semiconductor device 400 can be used to implement the IGBTs 110 and 120 of the circuit 100. In some implementations, the device 400 can be a fan-out wafer level packaged device.

FIG. 4A illustrates a first side (e.g., a top side) of the device 400, while FIG. 4B illustrates a second side (e.g., a bottom side) of the device 400. As shown in FIG. 4A, the device 400 can include emitter terminal contacts 412 for an IGBT implemented in the device 400. As also shown in FIG. 4A, the device 400 can include a gate terminal contact 416 for the IGBT of the device 400. As shown in FIG. 4B, the device 400 can include (back side) collector terminal contacts 414 for the device 400.

FIGS. 5A through 5G are diagrams generally illustrating a manufacturing flow that can be used to produce the packaged semiconductor devices described herein. For instance, the manufacturing flow of FIGS. 5A-5G can be used to produce the example device 200, e.g., in accordance with the method 600 of FIG. 6 discussed below. Accordingly, for purposes of illustration, FIGS. 5A-5G will be discussed with further reference to FIGS. 2A-2E, as well as the circuit 100 of FIG. 1, which can be implemented in the device 200. However, it will be appreciated that the manufacturing flow of FIGS. 5A-5G can be used to produce packaged semiconductor devices have different configurations than the device 200, and/or implement different circuits than the circuit 100. In the example of FIGS. 5A-5G, the circuit 100 is implemented using multiple (two) high-side IGBTs 510a and 510b coupled in parallel with each other (e.g., with a common collector node, a common emitter node, and a common gate node). Likewise, the circuit 100, in the example of FIGS. 5A-5G, is implemented using multiple (two) low-side IGBTs 520a and 520b coupled in parallel with each other (e.g., with a common collector node, a common emitter node, and a common gate node). In this example, the IBGTs 510a, 510b, 520a and 520c can each be implemented using the semiconductor device 400 shown in FIGS. 4A and 4B.

Figure 5A:
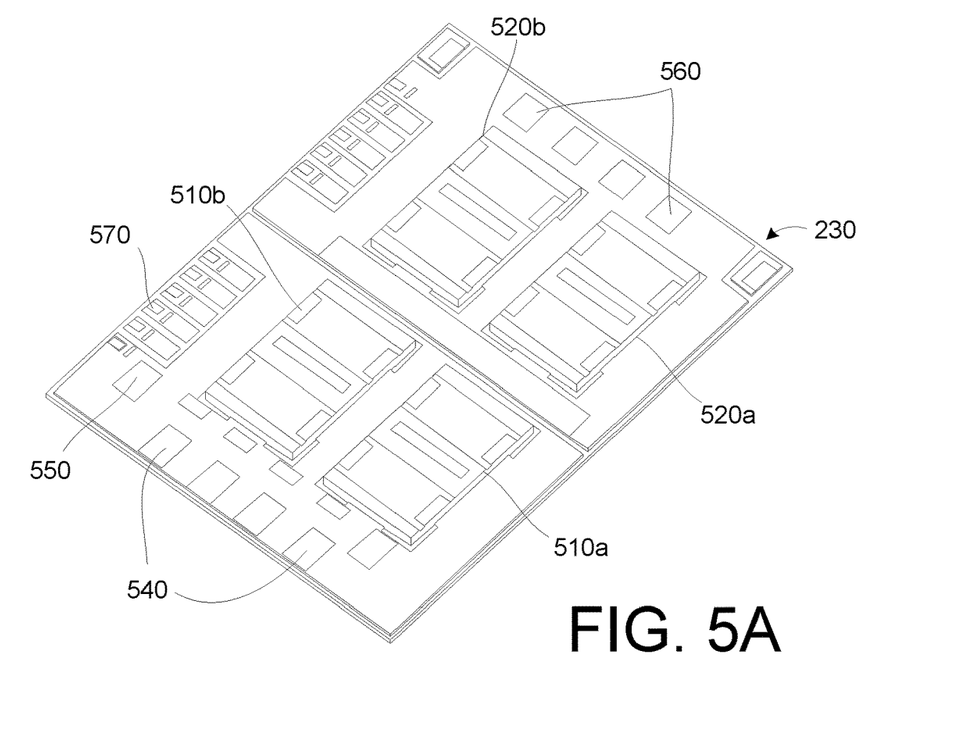
FIGS. 5A through 5G are diagrams generally illustrating a manufacturing flow that can be used to produce the packaged semiconductor devices described herein.

As shown in FIG. 5A, the example manufacturing flow (process, etc.) can include attaching the high-side IGBTs 510a and 510b to the metal layer 230a of the substrate 230 (e.g., establishing common collector node for the high-side IGBTs), and attaching the low-side IGBTs to the metal layer 230b of the substrate 230 (e.g., establishing common collector node for the low-side IGBTs). In some implementations, attaching the IGBTs 510a, 510b, 520a and 520b to the substrate 230 can include performing a solder screen print operation and a solder reflow operation. As discussed above, back side collector contacts of the IGBTs 510a, 510b, 520a and 520b can coupled with (soldered to) the respective metal layers 230a and 230b of the substrate 230. In some implementations, the substrate 230 can be a direct-bonded-metal substrate, an insulated-metal substrate, or any appropriate substrate.

As also shown in FIG. 5A, the substrate 230 can include contact points 540, e.g., for DLA attachment of the positive power supply terminal 140, contact points 550 for DLA attachment of the output terminal 160; and contact points 570 for DLA of the signal leads 170 of the device 200. Also shown in FIG. 5A, by way of reference, is an overlay of contact points 560 showing locations of contact points of the conductive clip 240 for coupling with the conductive clip 210 (where the conductive clip 240 is to be attached as shown in FIG. 5D). That is, the contact points 550 are shown in FIG. 5A (as well as FIGS. 5B and 5C) to illustrate, by way of reference only, the locations of contact points for the conductive fingers 210d of the conductive clip 210 (to be attached, e.g., using DLA, as shown in FIGS. 5F and 5G). As illustrated in FIGS. 2D and 3, the conductive clips 210 and 240 do not contact (are not coupled with) the metal layer 230a of the substrate 230, which, if such connections were made, would result in the positive power supply terminal 140 and the negative power supply terminal 150 of the circuit 100 being electrically shorted.

Figure 5B:
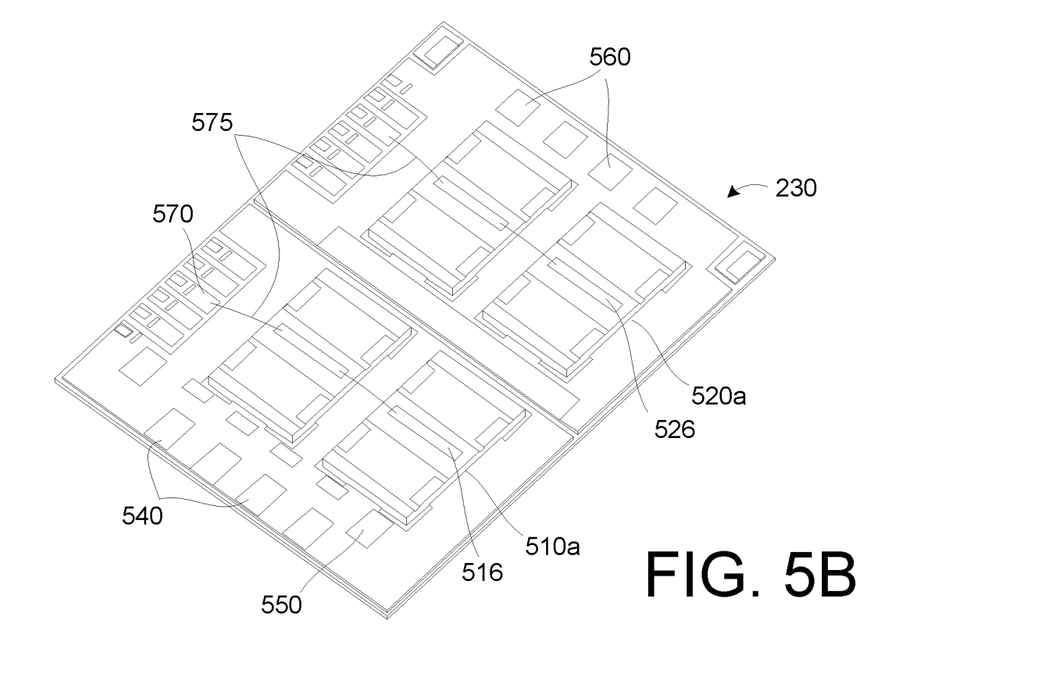
Figure 5C:
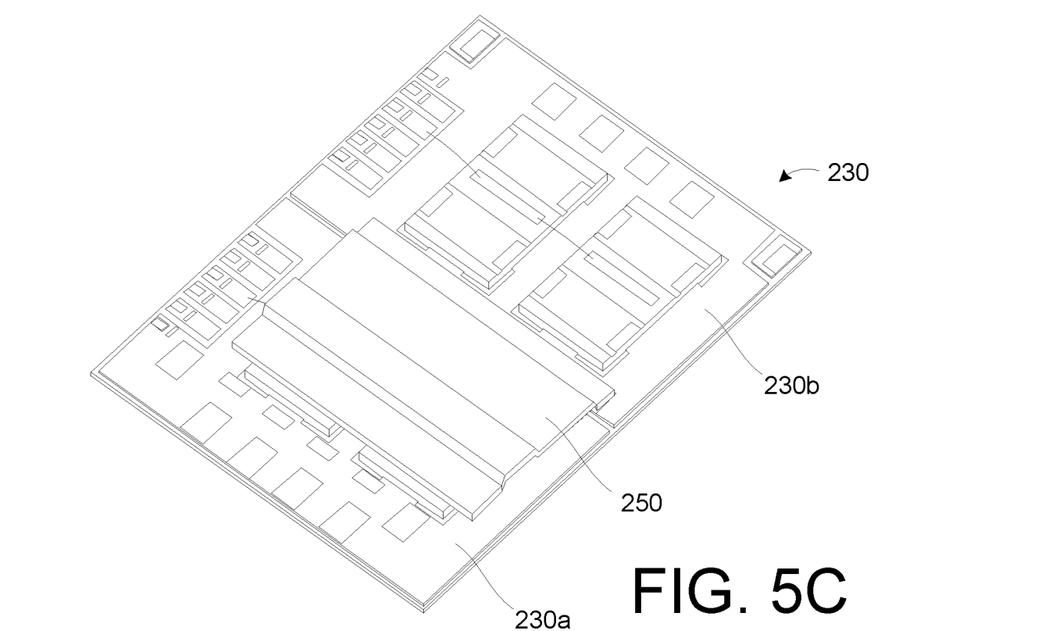
Figure 5D:
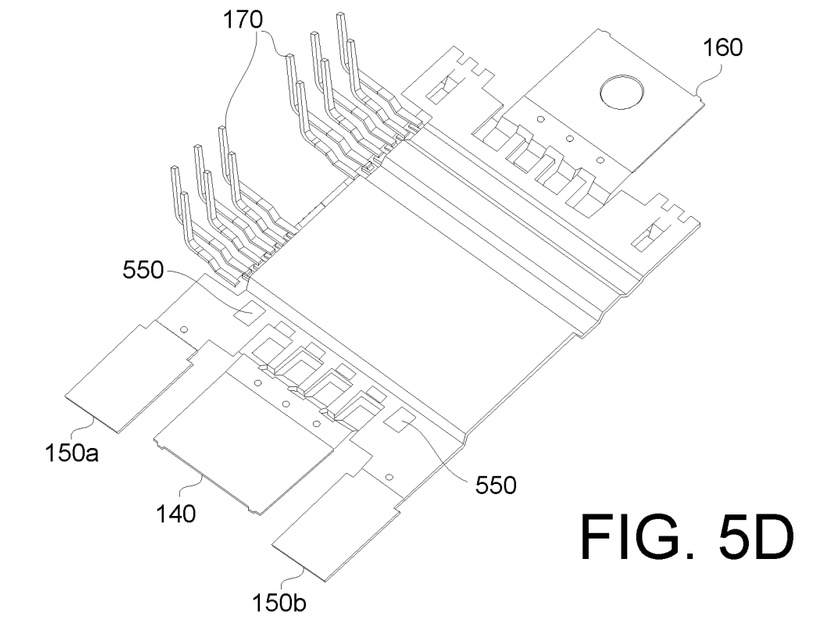

As shown in FIG. 5B, wire bonds 575 can be formed to electrically couple respective contact points 570 (and the to be attached signal pins 170) with respective gate terminals of the IGBTs 510a, 510b, 520a and 520b, such as a gate terminal 516 of the high-side IGBT 510a and a gate terminal 526 of the low-side IGBT 520a. As shown in FIG. 5C, the conductive clip 250 can be attached to the emitter terminals of the high-side IGBTs 510a and 510b and the metal layer 230b of the substrate 230, such as in the arrangement shown in FIG. 2D. In some implementations, a solder dotting and/or solder screen printing can be used for attachment of the conductive clip 250.

Referring to FIG. 5D, the conductive clip 240, the power supply terminals 140, 150a and 150b; the output terminal 160; and the signal leads 170 can be attached to the assembly of FIG. 5C, such as in the arrangement shown in FIG. 5D, as well as in FIGS. 2A-2E. As with attachment of the conductive clip 250 as shown in FIG. 5C, attachment of the conductive clip 240, the power supply terminals 140, 150a and 150b; the output terminal 160; and the signal leads 170 can include performing a solder dotting and/or solder screen printing operation. Further, after attachment of the conductive clip 240, the power supply terminals 140, 150a and 150b; the output terminal 160; and the signal leads 170, a solder reflow operation can be performed to reflow solder and couple (solder) the conductive clip 250, the conductive clip 240, the power supply terminals 140, 150a and 150b; the output terminal 160; and the signal leads 170 in place in the assembly.

FIG. 5D also illustrates the contact points 550 (e.g., for DLA of the conductive fingers 210d of the clip 210) on the conductive clip 240, which correspond with the overlays of the contact points 550 shown in FIGS. 5A-5C. In some implementations, the conductive clip 250, the conductive clip 240, the power supply terminals 140, 150a and 150b; the output terminal 160; and the signal leads 170 can include copper, plated copper, copper alloys, other conductive metals, and so forth, where the particular material(s) used will depend on the specific implementation.

Figure 5E:
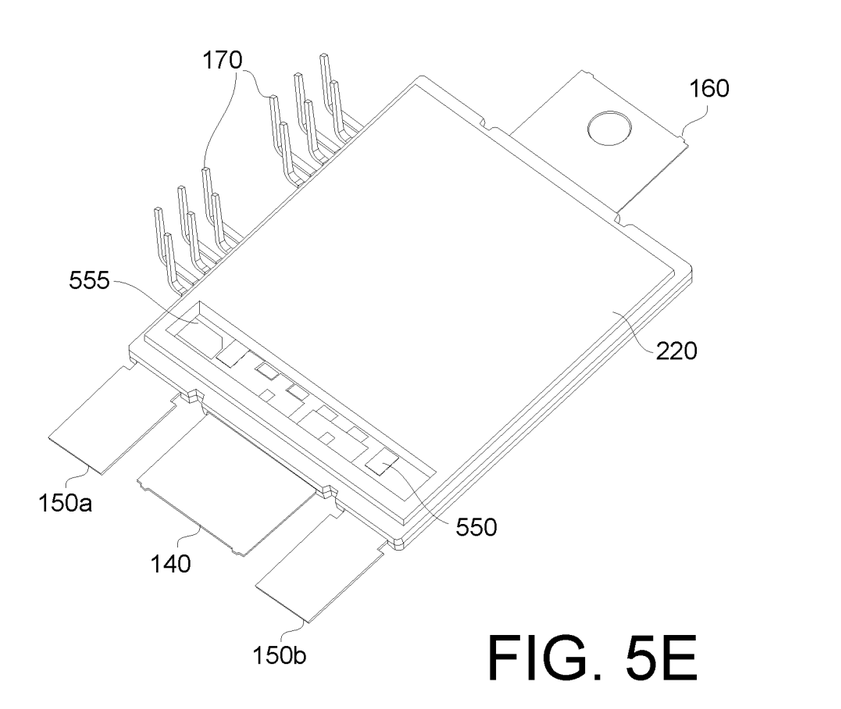
Figure 5F:
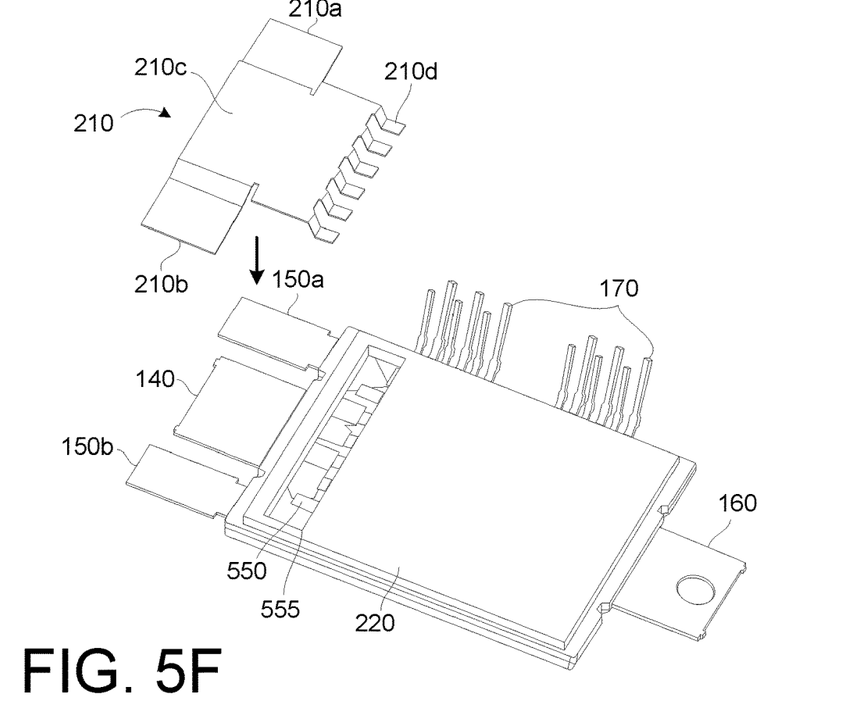
Figure 5G:
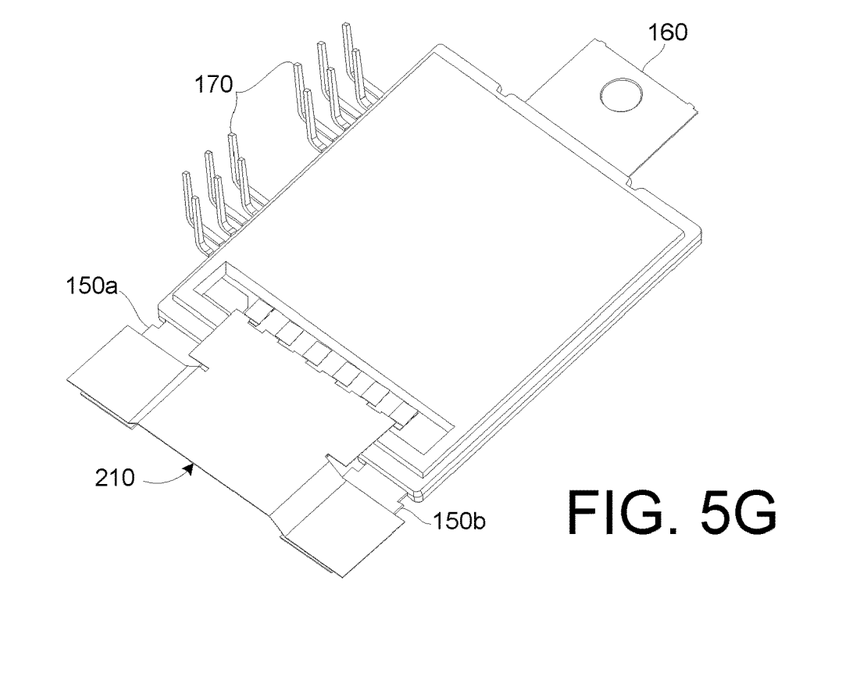

As shown in FIG. 5E, a molding operation (e.g., a gel molding or transfer molding operation) can be performed to encapsulate portions of the assembly of FIG. 5D in the molding compound 220. As shown in FIG. 5E, the contact points 550 on the conductive clip 240 are exposed through an opening 555 in the molding compound 220. In some implementations, the opening 555 can be defined using an etching operation, a grinding operation, a molding jig, etc.

As shown in FIGS. 5F and 5G, the conductive clip 210 can be coupled (e.g., using DLA) with the negative power supply terminals 150a and 150b, and the conductive clip 240, such as in the configuration shown in FIG. 5G, as well as in FIGS. 2A-2E. For instance, as illustrated in FIGS. 5F and 5G, the first portion 210a of the conductive clip 210 can be coupled with the first negative power supply terminal 150a, and the second portion 210b of the conductive clip 210 can be coupled with the second negative power supply terminal 150b. Further, the conductive fingers 210d of the conductive clip 210 can be coupled with the contact points 550 of the conductive clip 240. In this example, the conductive fingers 210d of the clip 210 are disposed, at least in part, in the opening 555 in the molding compound 220.

Figure 6:
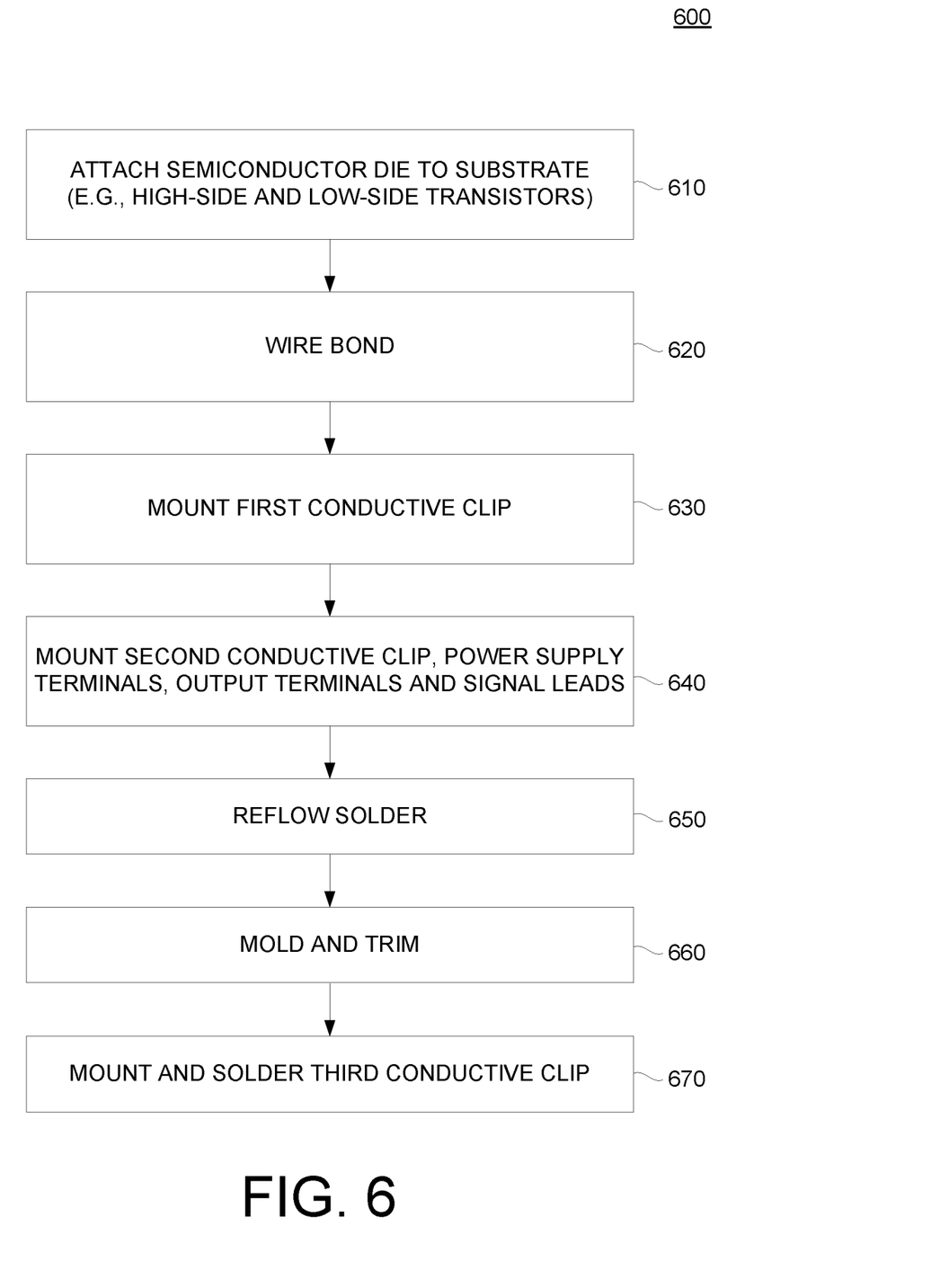
FIG. 6 is a flowchart illustrating a method for producing a packaged semiconductor device, which can implement the manufacturing flow of FIGS. 5A-5G.

FIG. 6 is a flowchart illustrating a method 600 for producing a packaged semiconductor device, which can implement the manufacturing flow of FIGS. 5A-5G to produce the example device 200. Accordingly, for purposes of illustration, the method 600 will be described with further reference to FIGS. 5A-5G, as well as FIGS. 1-2E, the circuit 100 and the device 200. However, it will be appreciated that the method 600 can be used to implement manufacturing flows that vary, or are different than the manufacturing flow of FIGS. 5A-5G. Further, the method 600 can be used to produce packaged semiconductor devices having different configurations than the device 200, and/or implement different circuits than the circuit 100.

At block 610, the method 600 includes attaching (coupling) semiconductor die to a substrate, such as attaching the high-side IGBTs 510a and 510b, and the low-side IGBTs 520a and 520b to the respective metal layers 230a and 230b of the substrate 230, such as shown in FIG. 5A. In some implementations, the semiconductor die can be attached (coupled) to the substrate at block 610 using a solder screen print operation and a solder reflow operation. At block 620, the method 600 includes forming wire bonds, such as the wire bonds 570 in FIG. 5B that electrically couple respective signal leads 170 (e.g., to be attached using DLA) with respective gate terminals (e.g., 516 and 526) of the IGBT devices 510a, 510b, 520a and 520b. In some implementations, additional wire bonds 570 can be formed at block 620 to make electrical connections to other elements of a circuit being implemented, such as the electrical connections and elements described above, e.g., with respect to FIG. 1.

At block 630, the method 600 includes mounting (attaching, coupling) a first conductive clip with the assembly of block 620, such as coupling the conductive clip 250 with the assembly of FIG. 5B, as shown in FIG. 5C. The clip mounting at block 630 can include solder dotting or solder printing the emitter terminal contacts of the high-side IGBTs 510a and 510b, and the metal layer 230b of the substrate 230. At block 640, the method 600 includes mounting (e.g., using solder dotting and or solder screen printing) a second conductive clip, such as the conductive clip 240, power supply terminals (e.g., power supply terminals 140, 150a and 150b); an output terminal, such as the output terminal 160; and signal leads, such as the signal leads 170, such as in the arrangement shown in FIG. 5D, as well as in FIGS. 2A-2E. At block 650, a solder reflow operation can be performed to reflow the solder applied at block 630 and 640 and couple (electrically couple) the conductive clips of blocks 630 and 640, the power supply terminals, the output terminal, and the signal leads in their respective locations in the device 200.

At block 660, the method 600 includes molding (e.g., using transfer molding, gel molding, etc.) the assembly of block 650 and/or FIG. 5D after the solder reflow of block 650, and performing trim and finish operations (e.g., to expose the contact points on the conductive clip, singulate individual package devices from one another, etc.). The molding and trim operations of block 660 can result in an assembly having a configuration as shown in FIG. 5E. At block 670, the method 600 can include mounting and soldering (e.g., using another solder reflow operation) a third conductive clip to the package assembly, such as attachment and soldering of the clip 210 to the negative power supply terminals 150a and 150b, and the contact points 550 of the conductive clip 240, e.g., as shown in FIGS. 5F and 5G.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package comprising:
   a substrate;
   a positive power supply terminal electrically coupled with the substrate, the positive power supply terminal being arranged in a first plane;
   a first negative power supply terminal that is laterally disposed from the positive power supply terminal, the first negative power supply terminal being arranged in the first plane;
   a second negative power supply terminal that is laterally disposed from the positive power supply terminal, the second negative power supply terminal being arranged in the first plane, the positive power supply terminal being disposed between the first negative power supply terminal and the second negative power supply terminal; and
   a conductive clip electrically coupling the first negative power supply terminal with the second negative power supply terminal via a conductive bridge, a portion of the conductive bridge being arranged in a second plane that is parallel to, and non-coplanar with the first plane.

2. The semiconductor device package of claim 1, wherein a line orthogonal to the first plane and the second plane intersects the positive power supply terminal and the portion of the conductive bridge arranged in the second plane.

3. The semiconductor device package of claim 1, wherein the conductive clip is a first conductive clip, the semiconductor device package further comprising a second conductive clip,
   the first negative power supply terminal, the second negative power supply terminal and the first conductive clip being electrically coupled with the second conductive clip.

4. The semiconductor device package of claim 3, further comprising:
   a semiconductor die disposed on the substrate; and
   a third conductive clip electrically coupling the semiconductor die with the substrate, the third conductive clip being arranged in parallel with the second conductive clip.

5. The semiconductor device package of claim 4, wherein the semiconductor die is a first semiconductor die, the semiconductor device package further comprising:
   a second semiconductor die disposed on the substrate, the second conductive clip electrically coupling the second semiconductor die with the first conductive clip, the first negative power supply terminal and the second negative power supply terminal.

6. The semiconductor device package of claim 5, further comprising:
   a molding compound, the molding compound:
      partially encapsulating the substrate, a surface of the substrate being exposed through the molding compound;
      partially encapsulating the second conductive clip, a portion of the second conductive clip being exposed through the molding compound, the first conductive clip being electrically coupled with the portion of the second conductive clip exposed through the molding compound, and
      encapsulating the first semiconductor die, the second semiconductor die and the third conductive clip,
   the first negative power supply terminal, the second negative power supply terminal and the first conductive clip being disposed, at least in part, external to the molding compound.

7. The semiconductor device package of claim 5, further comprising:
   an output terminal electrically coupled with the substrate,
   a first current path between the positive power supply terminal and the output terminal including the substrate, the first semiconductor die and the third conductive clip, and
   a second current path between the output terminal and the first negative power supply terminal, the second negative power supply terminal and the first conductive clip includes the substrate, the second semiconductor die and the second conductive clip, the second current path being substantially parallel with the first current path.

8. The semiconductor device package of claim 4, wherein the first negative power supply terminal, the second negative power supply terminal and the conductive clip are electrically coupled with the second conductive clip using direct-lead-attachment.

9. The semiconductor device package of claim 1, further comprising:
   an output terminal electrically coupled with the substrate.

10. The semiconductor device package of claim 9, wherein the positive power supply terminal and the output terminal are electrically coupled with the substrate using direct-lead-attachment.

11. The semiconductor device package of claim 1, further comprising:
    a molding compound encapsulating at least a portion of the semiconductor device package,
    the first negative power supply terminal, the second negative power supply terminal and the conductive clip being disposed, at least in part, external to the molding compound.

12. A semiconductor device package comprising:
a substrate;
a positive power supply terminal electrically coupled with the substrate, the positive power supply terminal being arranged in a plane;
a first negative power supply terminal that is laterally disposed from the positive power supply terminal, the first negative power supply terminal being arranged in the plane;
a second negative power supply terminal that is laterally disposed from the positive power supply terminal, the second negative power supply terminal being arranged in the plane, the positive power supply terminal being disposed between the first negative power supply terminal and the second negative power supply terminal;
a first semiconductor die disposed on the substrate;
a second semiconductor die disposed on the substrate;
a first conductive clip electrically coupling the first negative power supply terminal and the second negative power supply terminal with the first semiconductor die; and
a second conductive clip electrically coupling the second semiconductor die with the substrate, the second conductive clip being arranged parallel to the first conductive clip.

13. The semiconductor device package of claim 12, wherein the plane is a first plane, the semiconductor device package further comprising:
a third conductive clip electrically coupling the first negative power supply terminal with the second negative power supply terminal via a conductive bridge, a portion of the conductive bridge being arranged in a second plane that is parallel to, and non-coplanar with the first plane.

14. The semiconductor device package of claim 13, wherein the first conductive clip further electrically couples the first semiconductor die with the third conductive clip.

15. The semiconductor device package of claim 14, further comprising an output terminal electrically coupled with the substrate,
a first current path between the positive power supply terminal and the output terminal including the substrate, the second semiconductor die and the second conductive clip, and
a second current path between the output terminal and the first negative power supply terminal, the second negative power supply terminal and the third conductive clip includes the substrate, the first semiconductor die and the first conductive clip, the second current path being substantially parallel with the first current path.

16. The semiconductor device package of claim 12, wherein:
the first semiconductor die includes a low-side transistor of a power transistor pair; and
the second semiconductor die includes a high-side transistor the power transistor pair.

17. The semiconductor device package of claim 16, wherein the low-side transistor is a first low-side transistor and the high-side transistor is a first high-side transistor, the semiconductor device package further comprising:
a third semiconductor die including a second low-side transistor coupled in parallel with the first low-side transistor; and
a fourth semiconductor die including a second high-side transistor coupled in parallel with the first high-side transistor.

18. A semiconductor device package comprising:
a substrate;
a positive power supply terminal electrically coupled with the substrate, the positive power supply terminal being arranged in a first plane;
a first negative power supply terminal that is laterally disposed from the positive power supply terminal, the first negative power supply terminal being arranged in the first plane;
a second negative power supply terminal that is laterally disposed from the positive power supply terminal, the second negative power supply terminal being arranged in the first plane, the positive power supply terminal being disposed between the first negative power supply terminal and the second negative power supply terminal;
a first semiconductor die disposed on the substrate, the first semiconductor die including a low-side transistor of a power transistor pair;
a second semiconductor die disposed on the substrate, the second semiconductor die including a high-side transistor of the power transistor pair;
a first conductive clip electrically coupling the first negative power supply terminal and the second negative power supply terminal with the low-side transistor;
a second conductive clip electrically coupling the high-side transistor with the substrate, the second conductive clip being arranged parallel to the first conductive clip;
a third conductive clip electrically coupling the first negative power supply terminal with the second negative power supply terminal via a conductive bridge, a portion of the conductive bridge being arranged in a second plane that is parallel to, and non-coplanar with the first plane, the third conductive clip, the first negative power supply terminal and the second negative power supply terminal being electrically coupled with the first conductive clip; and
an output terminal electrically coupled with the substrate.

19. The semiconductor device package of claim 18, wherein:
the low-side transistor includes a first insulated-gate bipolar transistor (IGBT), the first conductive clip being coupled with an emitter terminal of the first IGBT, a collector terminal of the first IGBT being electrically coupled with the output terminal via the substrate; and
the high-side transistor includes a second IGBT, the second conductive clip being coupled with an emitter terminal of the second IGBT, a collector terminal of the second IGBT being electrically coupled with the positive power supply terminal via the substrate.

20. The semiconductor device package of claim 19, further comprising:
a first signal lead electrically coupled with a gate terminal of the first IGBT; and
a second signal lead electrically coupled with a gate terminal of the second IGBT.

* * * * *